United States Patent [19]

Iyer et al.

[11] Patent Number: 5,494,849
[45] Date of Patent: Feb. 27, 1996

[54] SINGLE-ETCH STOP PROCESS FOR THE MANUFACTURE OF SILICON-ON-INSULATOR SUBSTRATES

[75] Inventors: Subramanian S. Iyer, Yorktown Heights; Emil Baran, Brewster; Mark L. Mastroianni, Hopewell Jct., all of N.Y.; Robert A. Craven, Olivette, Mo.

[73] Assignee: Si Bond L.L.C., St. Peters, Mo.

[21] Appl. No.: 409,208

[22] Filed: Mar. 23, 1995

[51] Int. Cl.[6] .................................................. H01L 21/76
[52] U.S. Cl. ..................... 437/63; 437/974; 148/DIG. 12; 148/DIG. 135
[58] Field of Search ................................ 437/62, 63, 974; 148/DIG. 12, DIG. 135

[56] References Cited

U.S. PATENT DOCUMENTS

| | | | |
|---|---|---|---|
| 4,601,779 | 7/1986 | Abernathey et al. | 437/974 |
| 4,649,627 | 3/1987 | Abernathey et al. | 29/571 |
| 4,735,679 | 4/1988 | Lasky | 156/636 |
| 4,771,016 | 9/1988 | Bajor et al. | 148/DIG. 12 |
| 5,024,723 | 6/1991 | Goesele et al. | 156/628 |
| 5,032,544 | 7/1991 | Ito et al. | 437/228 |
| 5,071,785 | 12/1991 | Nakazato et al. | 437/62 |
| 5,152,857 | 10/1992 | Ito et al. | 156/153 |
| 5,213,953 | 5/1993 | Ogino et al. | 437/62 |
| 5,223,080 | 6/1993 | Ohta et al. | 156/626 |
| 5,234,535 | 8/1993 | Beyer et al. | 156/630 |
| 5,258,323 | 11/1993 | Sarma et al. | 437/974 |
| 5,295,331 | 3/1994 | Honda et al. | 51/283 E |
| 5,298,452 | 3/1994 | Meyerson | 437/81 |
| 5,308,776 | 5/1994 | Gotou | 437/21 G |
| 5,310,451 | 5/1994 | Tejwani et al. | 148/DIG. 12 |
| 5,340,435 | 8/1994 | Ito et al. | 156/632 |
| 5,344,524 | 9/1994 | Sharma et al. | 156/630 |
| 5,357,899 | 10/1994 | Bassous et al. | 117/4 |
| 5,362,667 | 11/1994 | Linn et al. | 437/62 |

Primary Examiner—Brian E. Hearn
Assistant Examiner—Trung Dang
Attorney, Agent, or Firm—Senniger, Powers, Leavitt & Roedel

[57] ABSTRACT

A single-etch stop process for the manufacture of silicon-on-insulator substrates. The process includes forming a silicon-on-insulator bonded substrate comprising a handle wafer, a device wafer, a device layer having a thickness of between about 0.5 and 50 micrometers, and an oxide layer with the device layer being between the device wafer and the oxide layer and the oxide layer being between the device layer and the handle wafer, the device wafer having a boron concentration of at least about $1 \times 10^{18}$ boron atoms/cm$^3$ and a resistivity of about 0.01 to about 0.02 ohm-cm. A portion of the device wafer is mechanically removed from the silicon-on-insulator bonded substrate wherein the device wafer has a total thickness variation across the surface of the wafer of less than about 2 micrometers and a defect-free surface after the mechanical removal step. The defect-free surface of the device wafer is thereafter etched away to expose the device layer, and the exposed device layer is polished to produce a silicon-on-insulator substrate having a device layer the total thickness variation of which does not exceed 10% of the maximum thickness of the device layer.

22 Claims, 2 Drawing Sheets

SINGLE-ETCH STOP PROCESS FOR THE MANUFACTURE OF SILICON-ON-INSULATOR SUBSTRATES

BACKGROUND OF THE INVENTION

This invention pertains to silicon-on-insulator (SOI) technology and, more particularly, to SOI substrates having relatively thick device layers with moderate thickness variation.

An SOI bonded wafer has a handle wafer, a device layer, and an oxide film (layer), constituting an insulating film, between the handle wafer and device layer. It is made from two semiconductor silicon wafers each having at least one face with a specular gloss finish. An oxide layer is formed on the specular glossy face of one or both wafers, and the two wafers are joined together with the specular glossy faces facing each other and with the oxide layer being between the two wafers. One of the wafers constitutes a handle wafer and the other constitutes a device wafer. The exposed surface of the device wafer is ground and/or etched and polished until the device wafer becomes a thin layer, i.e., the device layer. The joined wafers are heated to an appropriate temperature to increase the bonding strength.

Although various approaches have been proposed for fabricating SOI substrates, each has been found lacking in some respect. In general, certain of the methods proposed to date will produce SOI wafers with defect-free device layers having relatively low thickness variation, but these methods typically produce SOI wafers in relatively low yield and at relatively high cost. Other methods which have been proposed to date will produce SOI wafers in relatively high yield and at a favorable cost, but these methods typically produce SOI wafers having device layers which have an unacceptable thickness variation or which contain defects.

SUMMARY OF THE INVENTION

Among the several objects of this invention may be noted the provision of an improved process for fabricating SOI substrates having a device layer thickness of at least about 0.5 micrometers; the provision of such a process in which the variation in the thickness of the device is no greater than about 10% of the thickness of the device layer across the surface of the substrate; and the provision of such a process which produces SOI substrates in relatively high yield and relatively low cost.

In accordance with one aspect of the present invention, therefore, a single-etch stop process for the manufacture of silicon-on-insulator substrates is provided. The process includes forming a silicon-on-insulator bonded substrate comprising a handle wafer, a device wafer, a device layer having a thickness of between about 0.5 and 50 micrometers, and an oxide layer with the device layer being between the device wafer and the oxide layer and the oxide layer being between the device layer and the handle wafer. The device wafer has a boron concentration of at least about $1\times10^{18}$ boron atoms/cm$^3$ and a resistivity of about 0.01 to about 0.02 ohm-cm. A portion of the device wafer is removed from the silicon-on-insulator bonded substrate wherein the device wafer has a total thickness variation across the surface of the wafer of less than about 2 micrometers and a defect-free surface after the removal step. The defect-free surface of the device wafer is thereafter etched away to expose the device layer, and the exposed device layer is polished to produce a silicon-on-insulator substrate having a device layer the total thickness variation of which does not exceed 10% of the thickness of the device layer.

In accordance with another aspect of the present invention, a process for etching silicon from the surface of a substrate in an etchant comprising hydrofluoric acid, nitric acid and acetic acid is provided. The process comprises contacting the substrate with a solution containing hydrofluoric acid, nitric acid and acetic acid. After the etch rate begins to diminish, the surface is reactivated by exposing the surface to air or by immersing the surface in water. The surface is thereafter contacted once again with the solution containing hydrofluoric acid, nitric acid and acetic acid.

Other objects and features will be in part apparent and in part pointed out hereinafter.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
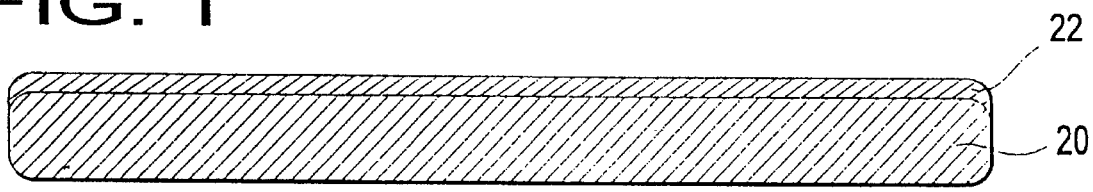
FIG. 1 is a schematic cross-sectional view of a device wafer used in a process of the present invention.

Referring now to the drawings, and first more particularly to FIG. 1, onto a silicon device wafer, indicated generally at 20, is deposited an epitaxial layer 22. Silicon device wafer 20 is a p+ wafer, having a boron concentration of between about $1\times10^{18}$ and about $5\times10^{20}$ boron atoms/cm$^3$, preferably between about $1\times10^{18}$ and about $3\times10^{20}$ boron atoms/cm$^3$, a resistivity of about 0.01 to about 0.02 ohm-cm, preferably a resistivity of about 0.01 to about 0.015 ohm-cm, a thickness of about 300 to 800 micrometers and a diameter which may be, for example, 100, 125, 150, 200 millimeters or more. Epitaxial layer 22 is preferably about 0.5 micrometers to 50 micrometers thick and of a conductivity type and resistivity type (e.g., n or p$^-$) to allow the use of preferential etchants as described herein. Epitaxial layer 22 is formed on the p+device wafer by epitaxial techniques known in the art, such as, gas source molecular beam epitaxy ("MBE"), ultra high vacuum chemical vapor deposition ("UHCVD"), or atmospheric pressure chemical vapor deposition ("APCVD"). Standard pre-epitaxial cleaning steps such as high temperature (e.g., at least about 900° C.) hydrogen pre-bakes may optionally be employed. In addition, an oxide layer may optionally be formed on epitaxial layer 22.

Figure 2:
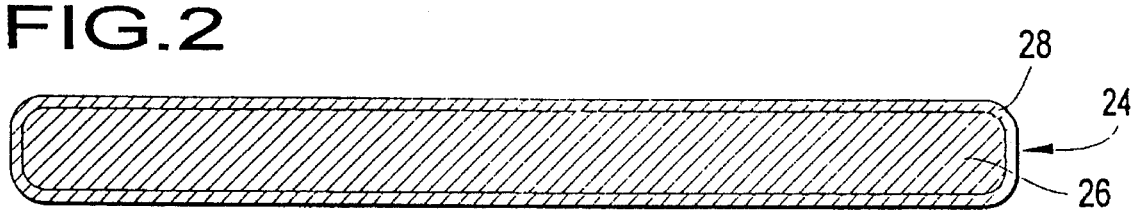
FIG. 2 is a schematic cross-sectional view of a handle wafer used in a process of the present invention.

As shown in FIG. 2, the handle wafer 24 preferably has a diameter which corresponds to the diameter of device wafer 20 and comprises a silicon layer 26 and an oxide layer 28. Because the handle wafer merely serves as a means for handling the substrate, the conductivity type and resistivity type of silicon layer 26 is not critical. Advantageously, therefore, handle wafer may be formed from very low cost silicon. In addition, the total thickness variation for handle wafer is not critical with total thickness variations on the order of about 10 micrometers or less being acceptable. Oxide layer 28 is grown on and surrounds the handle wafer 24 and preferably has a thickness of about 500 angstroms to about 5 micrometers.

Figure 3:
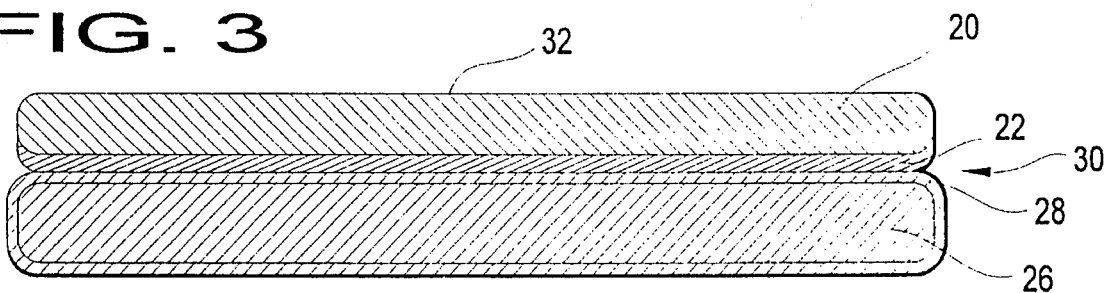
FIGS. 3–7 are schematic cross-sectional views of a silicon-on-insulator bonded wafer at various stages in a process of the present invention.

As shown in FIG. 3, the device wafer 20 is positioned on the handle wafer 24 so that the device layer 22 overlies the upper face 26 of the handle wafer and contacts the oxide layer 28. The device layer 22 is bonded to the oxide layer 28 at room temperature to form a bonded wafer, generally indicated at 30. The bond strength is thereafter increased by high temperature annealing. As shown in FIG. 3, an upper face of the device wafer 32 is exposed.

The device wafer 20 is removed from the bonded wafer 30 through a series of steps to expose the device layer 22. As will be discussed in greater detail elsewhere, the last step in exposing the device layer 22 is an etching step and it is critical that the surface being etched be defect-free. As used herein, the term "defect-free" means free from precipitated oxides and metal silicides and from defects in crystallinity such as stacking faults, partial dislocation loops, and threaded dislocations. Although the entire thickness of the device wafer 20 may be removed by selective etching, the selective etchants remove silicon at a relatively slow rate. To improve throughput, therefore, it is preferred that the bulk of the device wafer be mechanically removed by grinding and that roughness and damage created in the grinding process be removed prior to etching.

Referring again to FIG. 3, the upper face 32 of the device wafer 20 is ground with a conventional grinder using a relatively coarse grinding wheel such as a D46 grind wheel sold by Genauigkeits Machinenbau Nürnberg (Nürnberg, Germany) or a 320 grit grind wheel sold by Disco Hi-Tec America, Inc. to thin the device wafer. In this rough grinding step, a substantial portion, but not the entire thickness of the device wafer is removed. The amount of material removed in this rough grinding step is determined, in part, by the total roughness of the silicon surface, $R_T$, after the rough grinding and the additional process steps which will be required to eliminate the roughness and damage created during the rough grinding step. Preferably, the average surface roughness, $R_a$, after the rough grinding step is less than about 0.5 µm, more preferably less than about 0.3 µm, and the total surface roughness, $R_T$, after the rough grinding step is less than about 5 µm, more preferably less than 3 µm. The average roughness, $R_a$, and the total surface roughness, $R_T$, for a rough ground surface may be determined using a profilomoter with the average roughness, $R_a$, being measured over a one square-centimeter area.

To remove the roughness and damage created in the rough grinding step, the surface of the device wafer is preferably subjected to a second grinding step, i.e., a fine grinding step. For fine grinding, a 1200 mesh finish grinding wheel may be used. The amount of material removed in the fine grinding step is at least about three times, preferably at least about five times the total surface roughness value, $R_T$, of the silicon surface after the rough grinding step. If the total surface roughness value, $R_T$, of the silicon surface after the rough grinding step is between about 3 and about 5 micrometers, therefore, the amount of material removed in the fine grinding step is about 10 to about 15 micrometers, more preferably about 13 to about 15 micrometers. Fine grinding, however, imparts its own roughness and damage to the silicon surface and typically, the silicon surface after the fine grinding step will have an average surface roughness, $R_a$, of less than 0.1 µm, more preferably less than about 0.02 µm, and a total surface roughness, $R_T$, of less than about 0.75 µm, more preferably less than about 0.4 µm. The average roughness, $R_a$, and the total surface roughness, $R_T$, for a fine ground surface may be determined using a profilomoter which is capable of measuring roughness values of a nanometer or less, with the average roughness, $R_a$, being measured over a one square-centimeter area.

Figure 4:
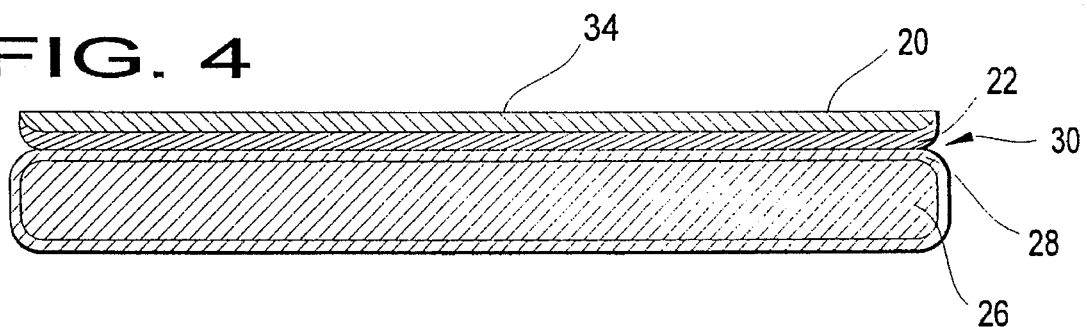

Referring to FIG. 4, the thinned device wafer 20, after grinding, has an exposed surface 34 and a thickness of about 20 to about 35 micrometers, more preferably, about 25 to about 30 micrometers. In addition, the grinding process should be controlled to minimize the total thickness variation ("TTV") across the ground wafer; for a 200 millimeter diameter wafer, for example, the TTV should be less than 2 micrometers, more preferably less than 0.8 micrometers and even more preferably no more than about 0.5 micrometers.

The ground surface of the thinned device wafer is preferably polished to remove any damage to the exposed surface 34 of the device wafer 20 resulting from the grinding step(s). Polishing is carried out using conventional polishing equipment and a sodium hydroxide stabilized colloidal silica sol such as those commercially available from E.I. du Pont de Nemours & Company (Wilmington, Del.), Nalco Chemical Co. (Naperville, Ill.), and Cabot Corp. (Tuscolo, Ill.) to produce a surface having an average roughness, $R_a$, as measured on a 1 mm×1 mm scan with an optical interferometer, of less than 2 angstroms, preferably less than 0.8 angstroms. The amount of silicon to be removed during the polishing step should be sufficient to remove all crystal damage remaining after the grinding steps. As a general rule, the amount of silicon to be removed should exceed about ten times the total surface roughness of the silicon surface after the fine grinding, i.e., $10\times R_T$, wherein $R_T$ is the total surface roughness of the silicon surface after the fine grinding step. Preferably, therefore, the amount of silicon removed during this polishing step is about 10 to about 25 µm and more preferably about 15 to about 20 µm. Importantly, however, the amount removed should be sufficient to yield a defect-free surface. The existence of a defect-free surface may be determined, for example, by bright light or automated laser inspection after cleaning the polished wafer surface.

Instead of mechanically removing device wafer 20, a significant portion of the device wafer may be removed by non-selective high removal rate chemical etching using, for example, an etchant comprising hydrofluoric acid, nitric acid, and acetic acid in the ratio of 3:5:3 parts by weight ($HF:HNO_3:CH_3COOH$) which is commonly referred to as CP-4. CP-4 etches silicon at a rate of about 80 micrometers per minute. The remaining portion of the device wafer 20 may then be removed by smooth grinding, polishing or a combination of smooth grinding and polishing as described above. If nonselective etchants are selected, care should be taken to ensure that the etching is discontinued before the device layer is reached.

Figure 5:
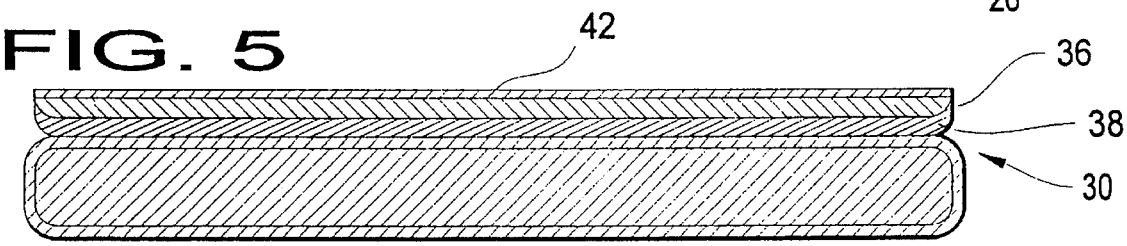
Figure 6:
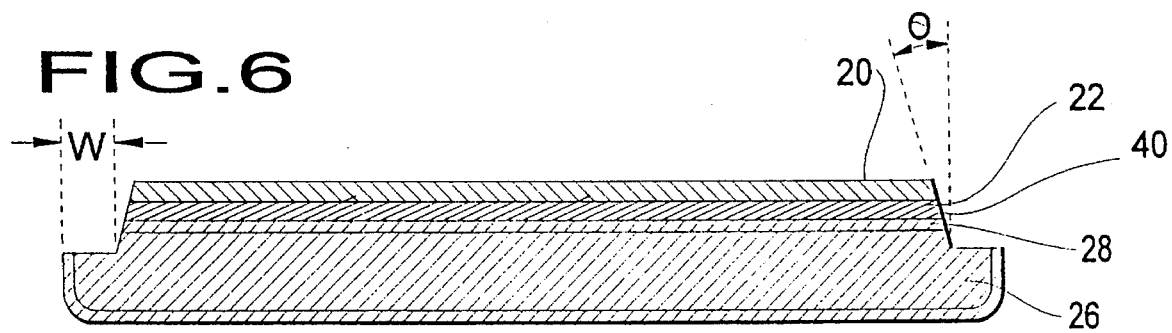

Referring to FIG. 5, the periphery of the bonded wafer 30 may optionally be abraded after grinding and prior to polishing to remove the edge margins 36, 38 which may contain areas of delamination between the device layer and the oxide layer. The width w (FIG. 6) of edge margins removed is approximately 2–10 mm. Also, the periphery of the bonded wafer 30 is preferably abraded at an angle θ (preferably 0°–30°) to form a beveled edge 40 to minimize the trapping of particles in the corner of that edge. The periphery of the bonded wafer 30 may be abraded by grinding, wet or dry etching, or by a chemical/mechanical polishing process. Masking 42 which is applied prior to the abrading process prevents debris, generated during the abrading process, from pitting or otherwise damaging the p+ device wafer 20 and device layer 22. After the periphery of the bonded wafer 30 is abraded, the masking 42 is stripped from the top surface of the bonded wafer.

Figure 7:
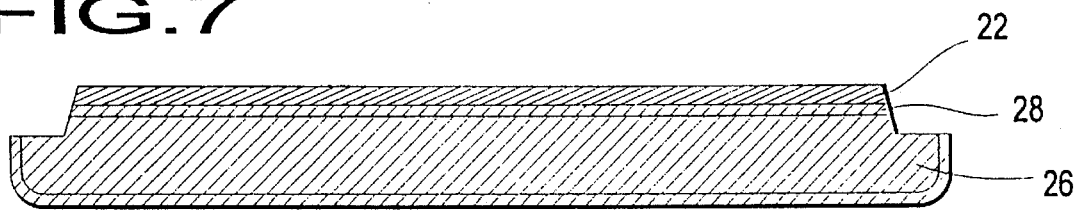

Referring now to FIG. 7, the ground, polished and optionally edge-stripped device wafer 20 is immersed in a suitable etchant which preferentially etches the device wafer without etching the device layer 22. Such etchants are well known in the art and include, for example, mixtures of hydrofluoric acid, nitric acid and acetic acid in a ratio of about 1:3:6–12 parts by weight ($HF:HNO_3:CH_3COOH$), and more preferably about 1:3:8 parts by weight ($HF:HNO_3:CH_3COOH$), and at a temperature of about 20° C. to about 30° C. A surfactant such as FC-193 manufactured by 3M Company may be added to improve the etching performance. Autocatalytic poisoning will typically cause a reduction of the etch rate and eventually the cessation of etching after about several hundred nanometers (i.e., about 200 to about 300 nanometers) of silicon are etched from the surface. To continue the etching process, therefore, the etchant may be continuously reconditioned by adding oxidants such as hydrogen peroxide or ozone, or alternatively by withdrawing the wafer from the etchant and immersing it in water, oxygenated water, ozonated water (e.g., about 1–2% by weight ozone) or by exposing it to air or other oxidizing atmosphere for about 1 to about 10 seconds, preferably about 1 to about 5 seconds. The reactivated surface is then reimmersed in the etchant and etching proceeds vigorously until another several hundred nanometers are removed. This process of reactivating the surface and immersing the reactivated surface in the etchant is continued until the device wafer 20 is removed and the device layer 22 is exposed at which point no amount of air/water exposure will reactivate the surface. In general, the amount of silicon removed in this etching step is at least about 5 micrometers, preferably between about 5 and about 15 micrometers, and most preferably about 5 to about 10 micrometers.

Alternatively, the ground, polished and optionally edge-stripped device wafer 20 may be etched using a rotating chuck and a spray. In this embodiment, the device wafer is mounted onto the chuck and rotated. Etchant is dispensed through a nozzle array which is attached to a movable arm and directed at the surface of the rotating wafer. The exact orientation, position and movement of the nozzle array, the rate of rotation of the wafer, the composition of the etchant, and the dispense rate of the etchant can be controlled to achieve a uniform and controlled etch rate. In addition, the surface can be reactivated (if autocatalytic poisoning occurs) by dispensing water, oxygenated or ozonated water, filtered air or the like through the nozzle array instead of etchant. Upon completion of the etching, the wafer may be spun dried.

Typically, the etched surface is mildly stained. To remove the stain, the exposed device layer may be subjected to a "touch" polish. That is, only about 100 to about 500 nanometers, preferably about 200 to about 400 nanometers, and more preferably about 300 nanometers of silicon is removed in a chemical/mechanical polishing process using, for example, a dilute ammonia stabilized colloidal silica slurry and conventional polishing equipment. A preferred ammonia stabilized colloidal silica slurry is Glanzox 3900, which is commercially available from Fujimi Incorporated of Aichi Pref. 452, Japan. Glanzox 3900 has a silica content of from about 8 to about 10% and a particle size of from about 0.025 to about 0.035 μm. If the ammonia stabilized silica slurry is not diluted prior to use, the polished wafer will not be as smooth as a wafer treated with a diluted slurry. A dilution of about one part silica slurry to about 10 parts deionized water is preferred.

After touch polishing, the device layer 22 has a thickness of about 0.5 to about 50 micrometers, preferably about 0.5 to about 20 micrometers, and a surface which is characteristic of a polished, conventional silicon wafer. That is, the resulting device layer has a surface with an average roughness, $R_a$, of no more than about 0.5 to 1 Angstrom over a surface a 1 mm×1 mm scan with an optical interferometer and a TTV which is about 10% of the maximum thickness of the device layer for a device layer thickness of about 3 microns and less and a TTV which is less than 10% of the maximum thickness of the device layer for a device layer thickness of between 3 and 50 microns.

To getter any residual boron in the device layer, the polished surface may be thermally oxidized at a temperature greater than about 900° C. Any residual boron is segregated in the oxide which is then stripped using, for example, an aqueous solution containing hydrofluoric acid.

As previously described, the high temperature annealing step (to increase the bonding strength between the device layer of the device wafer and the oxide layer of the handle wafer) may be carried out immediately after the room temperature bonding step. Alternatively, however, the high temperature annealing step may be carried out after the device wafer is etched away and the device layer is exposed. Deferring the high temperature annealing step until after the device wafer is removed advantageously minimizes the diffusion of boron from the $p^+$ device wafer into the device layer.

In view of the above, it will be seen that the several objects of the invention are achieved and other advantageous results attained. As various changes could be made in the above constructions and processes without departing from the scope of the invention, it is intended that all matter contained in the above description or shown in the accompanying drawings shall be interpreted as illustrative and not in a limiting sense.

What is claimed is:

1. A single-etch stop process for the manufacture of silicon-on-insulator substrates comprising forming a silicon-on-insulator bonded substrate comprising a handle wafer, a device wafer, a device layer having a thickness of between about 0.5 and 50 micrometers, and an oxide layer with the device layer being between the device wafer and the oxide layer and the oxide layer being between the device layer and the handle wafer, the device wafer having a boron concentration of at least about $1 \times 10^{18}$ boron atoms/cm$^3$ and a resistivity of about 0.01 to about 0.02 ohm-cm, removing a portion of the device wafer from the silicon-on-insulator bonded substrate, the device wafer having a total thickness variation across the surface of the wafer of less than about 2 micrometers and a defect-free surface after the removal step, etching away the defect-free surface of the device wafer to expose the device layer, and polishing the exposed device layer to produce a silicon-on-insulator substrate having a device layer the total thickness variation of which does not exceed 10% of the maximum thickness of the device layer.

2. A process as set forth in claim 1 wherein the step of removing a portion of the device wafer comprises a two-stage process in which a coarse material removal stage is followed by a smooth grinding stage.

3. A process as set forth in claim 2 wherein the coarse material removing stage comprises chemically etching or grinding.

4. A process as set forth in claim 2 wherein the step of removing a portion of the device wafer additionally comprises polishing the surface of the device wafer after the smooth grinding stage.

5. A process as set forth in claim 1 wherein the step of etching away the defect-free surface of the device wafer comprises immersing the silicon-on-insulator bonded substrate in a bath containing hydrofluoric acid, nitric acid and acetic acid and reconditioning the bath by adding peroxide, ozone or other oxidant to the bath.

6. A process as set forth in claim 1 wherein the step of etching away the defect-free surface of the device wafer comprises immersing the silicon-on-insulator bonded substrate in a bath containing hydrofluoric acid, nitric acid and acetic acid and, after the etch rate begins to diminish, withdrawing the silicon-on-insulator bonded substrate from the bath, reactivating the device wafer surface, and reimmersing the silicon-on-insulator bonded substrate in the bath containing hydrofluoric acid, nitric acid and acetic acid.

7. A process as set forth in claim 6 wherein the device wafer surface is reactivated by being exposed to air or by being immersed in water.

8. A process as set forth in claim 6 wherein the steps of reactivating the device wafer surface and reimmersing the silicon-on-insulator bonded substrate in the bath containing hydrofluoric acid, nitric acid and acetic acid are repeated at least twice.

9. A process as set forth in claim 8 wherein the device wafer surface is reactivated by being exposed to air or by being immersed in water.

10. A process as set forth in claim 8 wherein the surface is reactivated by immersing the surface in water and the water contains ozone.

11. A process as set forth in claim 1 wherein the exposed device layer is polished using an ammonia stabilized colloidal silica slurry.

12. A process as set forth in claim 1 wherein no more than about 200 nm of silicon are removed when the exposed device layer is polished.

13. A process as set forth in claim 1 wherein the thickness of the device wafer after the step of mechanically removing a portion of the device wafer from the silicon-on-insulator bonded substrate is between about 10 and about 30 micrometers.

14. A process as set forth in claim 1 wherein the periphery of the bonded silicon-on-insulator bonded substrate is abraded by grinding.

15. A process as set forth in claim 1 wherein the silicon-on-insulator bonded substrate is subjected to a high temperature annealing step to increase the bonding strength after the device wafer is etched away to expose the device layer.

16. A single-etch stop process for the manufacture of silicon-on-insulator substrates comprising forming a silicon-on-insulator bonded substrate comprising a handle wafer, a device wafer, a device layer having a thickness of between about 0.5 and 50 micrometers, and an oxide layer with the device layer being between the device wafer and the oxide layer and the oxide layer being between the device layer and the handle wafer, the device wafer having a boron concentration of at least about $1\times10^{18}$ boron atoms/cm$^3$ and a resistivity of about 0.01 to about 0.02 ohm-cm, grinding away a portion of the device wafer from the silicon-on-insulator bonded substrate and polishing the ground surface of the device wafer, the device wafer having a thickness of between about 10 and about 30 micrometers, a total thickness variation across the surface of the wafer of less than about 2 micrometers, and a defect-free surface after the ground surface is polished, etching away the defect-free surface of the device wafer to expose the device layer, and polishing the exposed device layer using an ammonia stabilized colloidal silica slurry to produce a silicon-on-insulator substrate having a device layer the total thickness variation of which does not exceed 10% of the maximum thickness of the device layer, the amount of silicon being removed from the exposed device layer during the polishing step being no more than about 200 nm of the thickness of the exposed device layer.

17. A process as set forth in claim 16 wherein the silicon-on-insulator bonded substrate is subjected to a high temperature annealing step to increase the bonding strength after the device wafer is etched away to expose the device layer.

18. A process as set forth in claim 16 wherein the step of etching away the defect-free surface of the device wafer comprises immersing the silicon-on-insulator bonded substrate in a bath containing hydrofluoric acid, nitric acid and acetic acid and, after the etch rate begins to diminish, withdrawing the silicon-on-insulator bonded substrate from the bath, reactivating the device wafer surface, and reimmersing the silicon-on-insulator bonded substrate in the bath containing hydrofluoric acid, nitric acid and acetic acid.

19. A process as set forth in claim 18 wherein the device wafer surface is reactivated by being exposed to air or by being immersed in water.

20. A process as set forth in claim 18 wherein the steps of reactivating the device wafer surface and reimmersing the silicon-on-insulator bonded substrate in the bath containing hydrofluoric acid, nitric acid and acetic acid are repeated at least twice.

21. A process for etching silicon from the surface of a substrate in an etchant comprising hydrofluoric acid, nitric acid and acetic acid, the process comprising contacting the surface with the etchant and, after the etch rate begins to diminish, reactivating the surface by exposing the surface to air or by immersing the surface in water and thereafter again contacting the surface with the etchant.

22. A process as set forth in claim 21 wherein the surface is reactivated by immersing the surface in water and the water contains oxygen or ozone.

* * * * *